United States Patent
Wang et al.

(10) Patent No.: US 9,224,951 B1
(45) Date of Patent: Dec. 29, 2015

(54) CURRENT-LIMITING ELECTRODES

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Federico Nardi, Palo Alto, CA (US); Milind Weling, Pleasanton, CA (US)

(73) Assignees: Intermolecular, Inc., San Jose; Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/336,652

(22) Filed: Jul. 21, 2014

(51) Int. Cl.
H01L 27/24 (2006.01)
H01L 45/00 (2006.01)

(52) U.S. Cl.
CPC .............. *H01L 45/145* (2013.01); *H01L 45/08* (2013.01); *H01L 45/1253* (2013.01); *H01L 45/1625* (2013.01); *H01L 45/1641* (2013.01); *H01L 27/24* (2013.01); *H01L 27/2409* (2013.01); *H01L 45/04* (2013.01); *H01L 45/1246* (2013.01); *H01L 45/1608* (2013.01)

(58) Field of Classification Search
CPC ..... H01L 27/24; H01L 27/2409; H01L 45/04; H01L 45/1608; H01L 45/1246
See application file for complete search history.

(56) References Cited

U.S. PATENT DOCUMENTS

| | | | |
|---|---|---|---|
| 6,084,579 A * | 7/2000 | Hirano | 345/205 |
| 6,479,882 B2 * | 11/2002 | Yamaguchi et al. | 257/537 |
| 7,067,422 B2 | 6/2006 | Nakamura | |
| 7,067,862 B2 | 6/2006 | Rinerson et al. | |
| 7,074,664 B1 | 7/2006 | White | |
| 7,400,027 B2 | 7/2008 | Joung | |
| 7,473,640 B2 | 1/2009 | Conley, Jr. | |
| 7,656,696 B2 * | 2/2010 | Joo et al. | 365/148 |
| 7,821,809 B2 | 10/2010 | Yoo | |
| 8,593,853 B2 * | 11/2013 | Katoh | G11C 13/004 365/100 |
| 8,675,387 B2 * | 3/2014 | Ikeda | G11C 13/0002 365/148 |
| 8,692,223 B2 * | 4/2014 | Moon et al. | 257/4 |
| 8,837,200 B2 * | 9/2014 | Tsuji | G11C 11/1673 365/148 |
| 9,076,959 B2 * | 7/2015 | Murase | H01L 45/08 |
| 9,087,582 B2 * | 7/2015 | Ninomiya | G11C 3/0069 |
| 9,112,144 B2 * | 8/2015 | Lee | H01L 45/04 |
| 9,153,778 B2 * | 10/2015 | Kim | H01L 45/146 |
| 2011/0080767 A1 * | 4/2011 | Rinerson | G11C 11/5685 365/148 |

(Continued)

OTHER PUBLICATIONS

Wu, M., et al.; LowPower and Highly Reliable Multilevel Operation in ZrO2 1T1R RRAM; Aug. 1, 2011; IEEE; IEEE Electron Device Letters vol. 32 No. 8 pp. 10261028.

(Continued)

*Primary Examiner* — Ida M Soward (57) ABSTRACT

A resistive-switching memory (ReRAM cell) has a current-limiting electrode layer that combines the functions of an embedded resistor, an outer electrode, and an intermediate electrode, reducing the thickness of the ReRAM stack and simplifying the fabrication process. The materials include compound nitrides of a transition metal and one of aluminum, boron, or silicon. In experiments with tantalum silicon nitride, peak yield in the desired resistivity range corresponded to ~24 at % silicon and ~32 at % nitrogen, believed to optimize the trade-off between inhibiting $TaSi_2$ formation and minimizing nitrogen diffusion. A binary metal nitride may be formed at one or more of the interfaces between the current-limiting electrode and neighboring layers such as metal-oxide switching layers.

20 Claims, 6 Drawing Sheets

(56) References Cited

U.S. PATENT DOCUMENTS

| | | | | |
|---|---|---|---|---|
| 2012/0236624 A1* | 9/2012 | Costa | ................... | G11C 11/56 365/148 |
| 2014/0036572 A1* | 2/2014 | Takashi | ................ | G11C 3/0007 365/148 |
| 2014/0166969 A1* | 6/2014 | Tendulkar | ........... | H01L 45/1608 257/4 |
| 2014/0357046 A1* | 12/2014 | Hsueh | ................. | H01L 45/1608 438/382 |
| 2015/0179930 A1* | 6/2015 | Nardi | ................. | H01L 45/1253 257/4 |
| 2015/0188045 A1* | 7/2015 | Wang et al. | ............. | H01L 45/08 257/4 |

OTHER PUBLICATIONS

B. Butcher et al.; High Endurance Performance of 1T1R HfOx based RRAM at Low 20uA Operative Current and Elevated 150 Temperature; Jan. 1, 2011; IEEE.

H.C. Wen et al.; Systematic Investigation of Amorphous TransitionMetalSiliconNitride Electrodes for Metal Gate CMOS Applications; Jan. 1, 2005; 2005 Symposium on VLSI Technology Digest of Technical Papers.

* cited by examiner

CURRENT-LIMITING ELECTRODES

BACKGROUND

Related fields include semiconductor devices and their fabrication; in particular, thin-film components of resistive-switching non-volatile memory (ReRAM).

Nonvolatile memory elements are used in computers and other devices requiring persistent data storage (e.g., cameras, music players). Some traditional nonvolatile memory technologies (e.g., EEPROM, NAND flash) have proven difficult to scale down to smaller or higher-density configurations. Therefore, a need has developed for alternative nonvolatile memory technologies that can be scaled down successfully in terms of performance, reliability, and cost.

In resistive-switching-based nonvolatile memory, each individual cell includes a bistable variable resistor. It can be put into either of two states (low-resistance or high-resistance), and will stay in that state until receiving the type of input that changes it to the other state (a "write signal"). The resistive state of the variable resistor corresponds to a bit value (e.g., the low-resistance state may represent logic "1" and the high-resistance state may represent logic "0"). The cell is thus written to by applying a write signal that causes the variable resistor to change resistance. The cell is read by measuring its resistance in a way that does not change it. Preferably, write and read operations should require as little power as possible, both to conserve energy and to avoid generating waste heat.

Many ReRAM devices change resistance by creating and destroying, or lengthening and shortening, one or more conductive paths through a variable-resistance layer or stack while the bulk material remains static (e.g., it does not change phase). The bulk material is often a highly insulating dielectric. The conductive paths (also known as "percolation paths") are formed when an electric field organizes conductive or charged defects or impurities into a filament stretching from one interface to the other, with sufficient defect density that charge carriers can easily traverse the layer by tunneling from defect to defect. To return the variable resistor to the high-resistive state, it is often not necessary to destroy the entire filament, but only to introduce a gap too wide for tunneling somewhere along the filament's length. Some of the types of defects that have been used include metal clusters and oxygen (or nitrogen) vacancies.

The "forming process" that creates the very first filament in a newly fabricated ReRAM cell is risky. The defects may be randomly scattered through the bulk of the variable-resistance layer, or they may be in some other layer such as an electrode or other source layer. Some cells may need stronger electric fields than others to collect the defects into a filament because the initial defect distributions may vary from cell to cell. Substantial force is necessary to push impurity atoms through a solid (e.g., metal, oxygen, or nitrogen) or break ionic bonds typical of high-ionicity materials such as hafnium oxide ($HfO_x$) and other "high-k" dielectrics. The risk is of "over-forming;" creating a filament so wide or dense that the operating write signals are too weak to break it. An over-formed cell cannot be rewritten. At this point the entire device has been built, so the investment has been significant and the cost of failure is high.

One approach to protecting ReRAM variable-resistance layers from over-forming is the addition of a current-limiting element, such as a transistor or resistor, to each cell. Transistors are relatively complex and there is a limit to how far they can be scaled down to provide increased memory density. Resistors—referred to as "embedded resistors" when they are built into the cell—may in some cases add excessive thickness so that patterning the layers into cells becomes a challenge, particularly for 3D arrays.

Therefore, a need exists for a way to prevent overcurrent through ReRAM variable-resistance layers that is simple, that can be scaled down with the rest of the cell to facilitate increased memory density, and that adds only a tolerable amount of extra thickness to the stack.

SUMMARY

The following summary presents some concepts in a simplified form as an introduction to the detailed description that follows. It does not necessarily identify key or critical elements and is not intended to reflect a scope of invention.

Embodiments of a ReRAM cell include a first electrode, a second electrode, and a variable-resistance layer between the electrodes. The variable-resistance layer reversibly changes resistance between at least two stable states responsive to a write signal. The variable-resistance layer may include an oxide, nitride or oxynitride of aluminum, hafnium, silicon, titanium, tantalum, or zirconium. In some embodiments, a portion of the variable-resistance layer may include an oxide, nitride or oxynitride of hafnium, titanium, tantalum, or zirconium and another portion of the variable-resistance layer may include an oxide, nitride or oxynitride of silicon or aluminum. Either the first electrode or the second electrode may be a current-limiting electrode (CLE).

The CLE limits current through the variable-resistance layer to prevent over-forming, and may include a compound nitride of a transition metal and an additional element. Like an embedded resistor, it maintains a constant resistance while the variable-resistance layer switches between low and high resistance states. The transition metal may include at least one of hafnium (Hf), molybdenum (Mo), tantalum (Ta), titanium (Ti), or tungsten (W). The additional element may include aluminum (Al), boron (B), or silicon (Si).

The thickness of the CLE may be between 5 nm and 100 nm. The vertical resistance (perpendicular to the plane of the layer) of the CLE may be between 10 and 1000 k$\Omega$ for device dimensions between 10 nm and 500 nm. The resistivity of the CLE may be between 0.1 $\Omega\cdot$cm and 1000 $\Omega\cdot$cm.

In some embodiments, portions of the CLE may primarily include a binary nitride of the transition metal (with less than 5 at % of the additional element). The binary nitride portion may be at one or both of the interfaces, with the bulk of the layer near the center dominated by the a compound nitride of the transition metal and the additional element.

In some embodiments, both the first electrode and the second electrode may be CLEs, each including a compound nitride of a transition metal and an additional element. The composition of the two CLEs may be the same, or may be different.

Embodiments of methods for fabricating the CLEs may include sputtering a transition metal and an additional element over a substrate in a nitrogen-containing ambient, then annealing the substrate. The additional element may be at least one of aluminum, boron, or silicon. The sputtering in the nitrogen-containing ambient may form a compound nitride layer over the substrate. Anneal temperatures may range from about 500 C to about 800 C. In some embodiments, the annealing temperature may be about 750-800 C when the second material is silicon, or about 500-550 C when the second material is aluminum or boron.

An atomic percentage (at %) of nitrogen in the compound nitride layer may be sufficiently high that the compound nitride layer contains less than 5% transition-metal aluminide, boride, or silicide, yet sufficiently low that less than 5% of the nitrogen diffuses out of the compound nitride layer during the annealing. The atomic percentage of nitrogen in the compound nitride layer may be controlled by adjusting a flow rate of nitrogen relative to a flow rate of non-reactive gases in the nitrogen-containing ambient. For example, the flow rate of nitrogen may be between 33% and 37% of the flow rate of all gases in the nitrogen-containing ambient if the first material is tantalum and the second material is silicon. This may vary between different types of sputter tools and different chamber configurations. An atomic percentage (at %) of nitrogen in the compound nitride layer (e.g., as measured by X-ray photoelectron spectroscopy (XPS)), may be between 15% and 32%.

The at % of the second material (e.g., Si) in the compound nitride layer may be between 15% and 26%. One or more optional steps of sputtering the first material in the nitrogen-containing ambient may be added to form a binary transition-metal nitride portion under or over the compound nitride layer. In some embodiments, the first material and the second material may be sputtered from separate targets, forming a gradient nitride layer by varying the relative amount of material sputtered from each of the separate targets.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

As used herein, the following terms shall have the following meanings unless associated text or context indicates an exception:

"A," "an," and singular nouns: May include plural variations, e.g., "a layer" may mean "one or more layers."

"About" or "approximately": Within ±10% variation.

"Above" and "over": Either directly contacting or separated by intervening elements; may conform to an underlying 3D structure.

"Amorphous": Exhibits less than 30% crystallinity as measured by a technique such as x-ray diffraction (XRD).

"Between" (range of values): Both boundary values and any value between the boundaries can be within the scope.

"Binary nitride": A nitride of a single element (e.g., TaN).

"Compound nitride": A nitride of two or more elements (e.g., TaAlN).

"Conductive:" Resistivity <1e-5 Ω·m at the intended operating temperature.

"Constant resistance" (in a ReRAM embedded resistor layer): Resistance that remains approximately constant (e.g., ±25%) in response to either "read" or "write" signals.

"Covalent" (material): at least 55% of the bonds in the material are covalent.

"Crystalline": Exhibits at least 30% crystallinity as measured by a technique such as x-ray diffraction (XRD).

"Film" and "layer": Interchangeably describe a portion of a stack; may include multiple sub-layers (e.g., a nanolaminate).

"First," "second," and other ordinals: For differentiation only, rather than imposing any specific spatial or temporal order.

"High-k material," "high-k layer," "high-k dielectric" (interchangeable): A material or layer with a dielectric constant ("k") greater than 9.

"Ionic" (material): At least 55% of the bonds in the material are ionic.

"Operable" (for a specific purpose): Would satisfactorily fulfill that purpose given suitable connections, signals, or other external conditions.

"Or" in a list: Any, all, or any subset of list may be used.

"Substantially": Within up to ±5% variation.

"Substrate": A wafer or any other workpiece on which formation or treatment of material layers is desired. Non-limiting examples include silicon, germanium, silica, sapphire, zinc oxide, SiC, AlN, GaN, Spinel, silicon on oxide, silicon carbide on oxide, glass, gallium nitride, indium nitride and aluminum nitride, glasses, combinations or alloys thereof, and other solid materials.

"Variable resistance" (in a ReRAM resistive-switching layer): Resistance that is reversibly switched between at least two stable states by "write" signals, but remains approximately constant in response to "read" signals.

"Vertical": In a direction perpendicular to a nominally planar surface of the substrate.

Figure 1A:
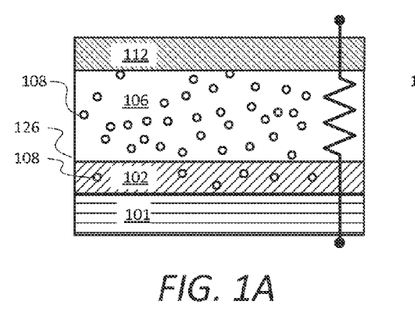
FIGS. 1A and 1B conceptually illustrate initial filament formation in the variable-resistance layer of a ReRAM cell.
Figure 1B:
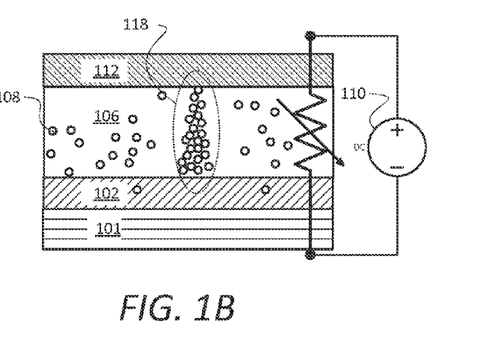

FIGS. 1A and 1B conceptually illustrate initial filament formation in the variable-resistance layer of a ReRAM cell. FIG. 1A is a schematic representation of layers in a ReRAM cell before any filaments are formed. Although some ReRAM cells include additional layers, the illustration is simplified to show only substrate 101 (which may include other structures and layers), electrodes 102 and 112, and VR layer 106 between the electrodes. Electrode 102 and 112 are usually conductive layers. In this example, top electrode 112 is an inert electrode that does not react with, or exchange material or defects with, VR layer 106. In this example, bottom electrode 102 is a reactive or "source" electrode that may act as a source or reservoir of electrically active defects 108. In some embodiments, the bottom electrode may be inert and the top electrode may be reactive. Inert electrodes may be made of inert materials (e.g., noble metals) or may be rendered inert by a barrier layer between the electrode and the VR layer (e.g., polycrystalline silicon with a silicon oxide barrier layer). Reactive electrodes may be made of any sufficiently conductive material that provides the desired mobile defects; for example, titanium nitride for oxygen vacancies, or silver or copper for metal ions.

Defects 108 may travel through "reactive interface" 126 between reactive electrode 102 and VR layer 106, e.g., when mobilized by an electric field from an applied voltage. Defects 108 may be, by way of non-limiting example, metal ions, vacancies (e.g., oxygen vacancies), interstitial atoms, stress-induced lattice dislocations. Either alternatively or in addition, VR layer 106 may be formed with defects 108. If sufficient defects to form a filament are available in VR layer 106, both electrodes may be inert electrodes. VR layer 106 may be a high-k or low-k dielectric, a dielectric stack or, in some embodiments, a low-conductivity semiconductor. With no filament formed, the position, number, and distribution of defects 108 is not conducive to electron tunneling between bottom electrode 102 and top electrode 112.

In FIG. 1B, a voltage source 110 applies a forming-voltage pulse to electrodes 102 and 112, mobilizing defects 108 to form a filament 118 in VR layer 106. The defects may be gathered from an original distribution of VR layer 106, or they may enter VR layer 106 from a reactive electrode 102 (or some other type of defect-access layer), or they may be created in VR layer 106 by interaction of the electric field with another feature of the material, or any combination. In filament 118, the defects are sufficiently close together that electrons may tunnel from defect to defect through the VR layer from one electrode to the other. In some embodiments, the forming operation includes heating to enhance mobility of the defects within ReRAM cell 100.

In general, the forming operation is a one-time fabrication step that converts the original dielectric of VR layer 106 to a variable resistive material. Afterward, in operating the ReRAM cell, a lesser "reset" voltage may be applied to break at least the weak part of the filament and raise the resistance of the VR layer to a high resistance state (HRS), a lesser "set" voltage may be applied to restore the broken part of the filament and lower the resistance of the VR layer to a low resistance state (LRS), or an even lesser "read" voltage may be applied to sense the resistance of the VR layer without changing it. Moving, creating, or destroying the defects requires energy, but leaving them in place does not; therefore, the VR layer is non-volatile, retaining its written LRS or HRS state if the cell is unpowered. In some embodiments, the resistance values of the HRS and LRS are repeatable within ±20% or less.

Figure 2:
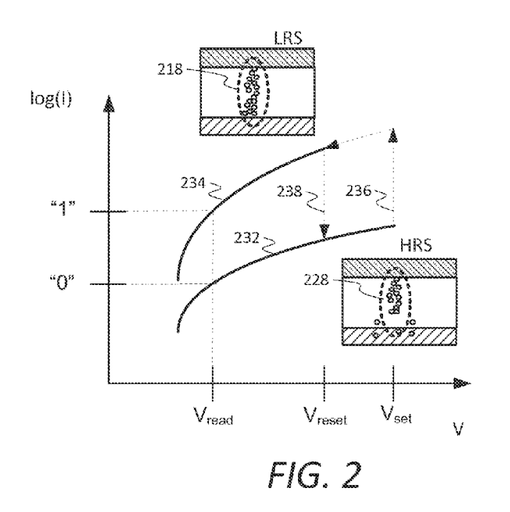
FIG. 2 is an example I-V plot for reading and writing a ReRAM cell.

FIG. 2 is an example I-V plot for reading and writing a ReRAM cell. Specifically, FIG. 2 is a plot of current passing through a unipolar ReRAM cell as a function of applied voltage according to some embodiments. The cell's response when the VR layer is in its HRS, with a broken filament 228, is plotted as curve 232. The cell's response when the VR layer is in its LRS, with a restored filament 218, is plotted as curve 234.

With two possible resistive states, the cell can store one bit of data. Some ReRAM cells may have three or more resistance states to enable multi-bit storage in a single cell. To change the stored value, a write voltage $V_{SET}$ or $V_{RESET}$ is applied to the cell. $V_{RESET}$ breaks complete filament 218 into broken filament 228, and $V_{SET}$ restores broken filament 228 to a complete filament 218. In a unipolar cell as illustrated here, $V_{SET}$ and $V_{RESET}$ have the same polarity. In a bipolar cell, $V_{SET}$ and $V_{RESET}$ have opposite polarities.

To read the stored value, a sensing or "read" voltage $V_{READ}$ is applied across the cell and the output current is measured. Because of Ohm's law, V=IR, for a given $V_{READ}$ the output current I depends on the cell resistance R, which depends on whether the VR layer is in its LRS or its HRS. In the illustrated example, the LRS corresponds to logic "1" and the HRS corresponds to logic "0," although some embodiments may reverse the correspondences.

ReRAM cells may be switched between LRS and HRS (rewritten) many times. Between switching events, any number of read operations may be performed. In some embodiments, the set voltage ($V_{SET}$) is between about 100 mV and 10V; e.g., between about 500 mV and 5V. The length of set voltage pulses ($t_{SET}$) may be less than about 100 milliseconds, less than about 5 milliseconds, or less than about 100 nanoseconds. The read voltage ($V_{READ}$) may be between about ⅒ and ½ of $V_{SET}$. In some embodiments, the currents sensed during read operations are greater than about 1 mA, or even greater than about 5 mA to allow for a fast detection of the logic state by small sense amplifiers. The length of a read voltage pulse ($t_{READ}$) may be comparable to the length of a set voltage pulse ($t_{SET}$) or may be shorter. ReRAM cells preferably can switch between LRS and HRS at least about $10^3$ times or, more desirably at least about $10^7$ times without failure. They preferably retain their data for at least about 5 years or, more desirably, at least about 10 years at temperatures up to 85° C. under constant application of $V_{READ}$. In some embodiments, low current leakage, such as less than about 40 A/cm² measured at 0.5 V per 20 Å of oxide thickness in HRS, may also be preferred.

Figure 3A:
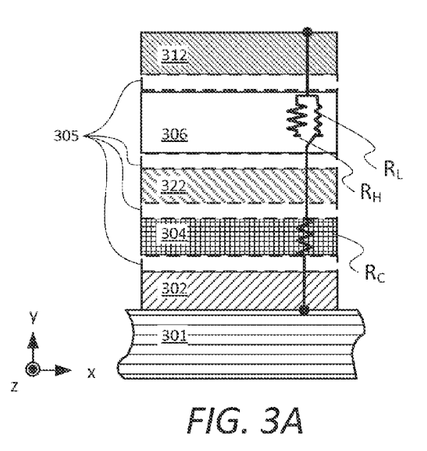
FIGS. 3A and 3B conceptually illustrate examples of ReRAM cells with conventional and current-limiting electrodes.
Figure 3B:
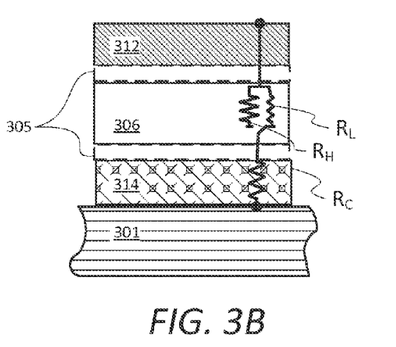

FIGS. 3A and 3B conceptually illustrate examples of ReRAM cells with conventional and current-limiting electrodes. As a point of reference, FIG. 3A illustrates a conventional ReRAM cell. Substrate 301 underneath the ReRAM cell may include other layers or structures, such as signal lines and current-steering or other selector components. The ReRAM cell may be connected to other cells or other devices by a first signal line 302 and a second signal line 312. Signal lines (e.g., word-lines and bit-lines) are connected to electrodes 302 and 312. Besides VR layer 306, various other layers may be between electrodes 302 and 312, such as embedded resistor (ER) layer 304 or intermediate electrode 322. Generally, the elements formed by the layers in the ReRAM cell are effectively connected in series.

The footprint (i.e., cross-sectional area in the x-z plane of FIG. 3) of the layers in the stack may be between about 20-100 nm². These elements may appear in any order within the stack; for example, in some embodiments ER layer 304 and intermediate electrode 322 may be either above or below VR layer 306.

Various interface layers 305 may optionally be formed between any of the cell elements. For example, a conductive interface layer may be formed between electrode 322 and ER layer 304 to provide a desired type of electrical contact (e.g., ohmic or Schottky) between electrode 322 and ER layer 304. Other non-limiting examples of interface layers include barrier layers, buffer layers, doping layers, nucleation layers, adhesion layers, getter layers, filament-shaping layers, and defect-access layers. Interface layers may be of any suitable thickness to perform their intended function. Some embodiments of ReRAM cells may omit interface layers; for example, ER layer 304 may directly interface VR layer 306. In some embodiments, VR layer 306 directly interfaces two conductive layers operable as electrodes.

In any of these configurations, the electrode on one side of VR layer 306 may be an inert electrode (not exchanging defects with VR layer 306) while an electrode on the other side of VR layer 306 may be reactive (exchanging defects with variable resistance layer 306). In oxygen-vacancy switching cells, the reactive electrode may include an oxygen getter or scavenger material that, assisted by the electric field of the forming or set signal, draws oxygen out of the VR layer to create oxygen vacancies.

Electrodes 302, 312, and 322 may be fabricated from conductive materials with desirable work functions, such as p-type or n-type polysilicon, transition metals, or transition metal alloys, nitrides, or carbides. Examples of electrode metals include titanium (Ti), tungsten (W), tantalum (Ta), cobalt (Co), molybdenum (Mo), nickel (Ni), vanadium (V), hafnium (Hf), aluminum (Al), copper (Cu), platinum (Pt), palladium (Pd), iridium (Ir) ruthenium (Ru). Alloys, nitrides, carbides, or silicon-doped versions of these metals may alternatively be used. Intermediate electrode 322 may be 5-500 nm thick.

VR layer 306 may include a dielectric or semiconducting material that can be reversibly switched between two or more stable resistive states (e.g., $R_H$ and $R_L$). In some embodiments, VR layer 306 a bandgap of about 4 eV or greater. The high bandgap may improve data retention, reduce the current leakage by reducing the amount of trapped charge, or increase the barrier that charge carriers must during read, set, and reset operations. Material examples include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). Other suitable materials include titanium oxide ($TiO_x$), nickel oxide ($NiO_x$), and cerium oxide ($CeO_x$). Semiconducting p-type or n-type metal oxides, such as zinc oxides ($Zn_xO_y$), copper oxides ($Cu_xO_y$), and their nonstoichiometric and doped variants, may also be used. VR layer 306 may be about 1-100 nm thick and be deposited by processes including, but not limited to, ALD, CVD, PVD, or plasma-enhanced processes.

ER layer 304 may include a ternary metal nitride, such as a metal silicon nitride, a metal aluminum nitride, or a metal boron nitride. Non-limiting examples of materials suitable for ER layer 304 include aluminum boron nitride ($AlBN_x$), aluminum silicon nitride ($AlSiN_x$), molybdenum aluminum nitride ($MoAlN_x$), molybdenum boron nitride ($MoBN_x$), molybdenum silicon nitride ($MoSiN_x$), tantalum aluminum nitride ($TaAlN_x$), tantalum boron nitride ($TaBN_x$), tantalum silicon nitride ($TaSiN_x$), titanium aluminum nitride ($TiAlN_x$), titanium boron nitride ($TiBN_x$), titanium silicon nitride ($TiSiN_x$), vanadium aluminum nitride ($VAlN_x$), vanadium boron nitride ($VBN_x$), vanadium silicon nitride ($VSiN_x$), tungsten aluminum nitride ($WAlN_x$), tungsten boron nitride ($WBN_x$), or tungsten silicon nitride ($WSiN_x$).

The silicon, aluminum, boron and/or nitrogen content of ER layer 304 tends to increase its resistivity, while the base metal (e.g., tantalum, titanium, tungsten, molybdenum) helps to maintain a stable resistivity and a high breakdown voltage through the forming operation and subsequent repeated read and write cycles. Ternary metal nitrides are often stable under high process temperatures, such as the typical 750° C., 60 second anneal used to activate some diodes, including some diode-type current steering elements used in ReRAM. In some embodiments, ER layer 304 retains characteristics such as resistivity or amorphousness after annealing at about 500-1000° C. for between about 10 seconds and 10 minutes. Such annealing conditions may be used, for example, to activate diodes or other elements on the same substrate. ER layer 304 may be between about 1 nm and 50 nm thick.

During read/write operation of the ReRAM cell, ER layer 304 may maintain a substantially constant resistivity $R_C$ under electric fields up to about 12 MV/cm. In some embodiments, the operating resistivity of ER layer 304 is between about 0.1-40 Ω·cm. The resistivity may be selected to provide a desired resistance at the planned device dimensions. At least to first order, $$R = \rho L / A$$

where R=resistance, ρ=resistivity, L=layer thickness (y-direction in FIG. 3) and A=footprint area (e.g., 20-100 nm²). Atomic ratios of one or more metals to aluminum, silicon, or boron in ER layer 304 may be manipulated to produce the desired resistivity (more Al, Si or B generally produces a higher resistivity). Often, higher nitrogen content also results in higher resistivity. The concentration of nitrogen may be between 10 atomic % and 80 atomic %.

In FIG. 3B, electrode 302, electrode 322, ER 304, and their intervening layers 303 (often provided to prevent unwanted interactions between electrodes and ERs) have been replaced with CLE layer 314, which conducts current like an electrode while limiting current like a resistor. This results in a significantly shorter ReRAM stack that is significantly simpler to fabricate.

Ternary nitrides pairing transition metals such as hafnium, molybdenum, tantalum, or titanium with aluminum, boron, or silicon as the additional element can be used for CLEs if their composition is optimized for the needed electrical properties and compatibility with the material of the VR layer. Experiments have shown that the relative concentrations of the transition metal, the additional element, and nitrogen are critical to this particular application. Materials with nominally similar constituents, used for gate electrodes, diffusion barriers, or other applications, are optimized for different goals; their relative concentrations of those constituents will not necessarily produce a satisfactory CLE.

Preferably, the CLE layer has a vertical (y-direction in FIG. 3A) resistance between 10 and 100 kΩ for 10-500 nm device dimensions. This may translate to a resistivity between 0.1 Ω·cm and 1000 Ω·cm. High yield is also desirable. In experiments with TaSiN, 50-70 nm CLEs with 22-32 at % N and 22-26 at % Si performed well.

Figure 4A:
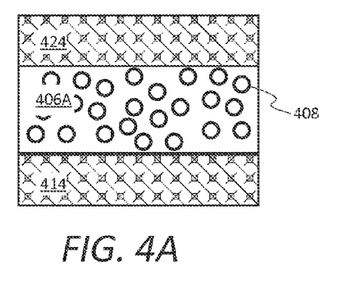
FIGS. 4A and 4B conceptually illustrate embodiments with two CLEs and a vacancy-rich VR layer.
Figure 4B:
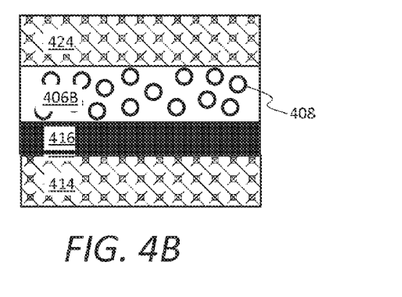

FIGS. 4A and 4B conceptually illustrate embodiments with two CLEs and a vacancy-rich VR layer. As illustrated, the stacks have been fully fabricated but the forming operation has not been done. In FIG. 4A, a single switching layer 406A has enough intrinsic defects 408 for a forming operation to collect into a switching filament. In FIG. 4B, the VR layer is a bi-layer of first VR layer 424, which has few or no defects, and second VR layer 406B, which has plentiful switchable defects 408. For example, first VR layer 406A may be high-k, ionic-bonded, crystalline, or sub-stoichiometric while second VR layer 406B may be low-k, covalent-bonded, amorphous, or stoichiometric. A forming operation can collect enough defects 408 from first VR layer 406B to force a filament through second VR layer 416. If enough defects for a switching filament are available in a VR layer or in some other layer between the electrodes, neither electrode needs to be a source electrode and they may both be CLEs. This may be convenient because the required resistance may be divided between two layers rather than being required of a single layer.

FIGS. 5A-D conceptually illustrate compound-nitride CLEs with one or more binary-nitride interfaces. Experiments showed that the yield of some ReRAM cells improved if a binary transition-metal nitride (e.g., TaN, HfN, WN), rather than a compound metal nitride (e.g., TaAlN, HfBN, WSiN) was in direct contact with the VR layer. This held true even when the VR layer shared the additional element (e.g., TaN in contact with $SiO_2$ had better yield than TaSiN in contact with $SiO_2$). Because neighboring layers that share an element are often more compatible than those with no elements in common, this may have been an unexpected result.

Figure 5A:
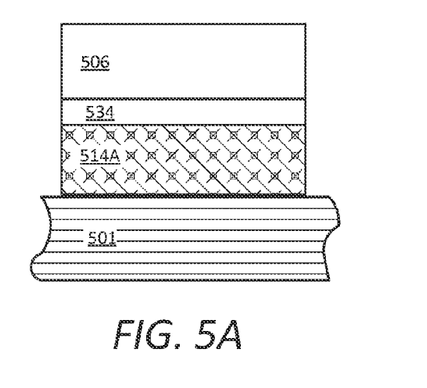
FIGS. 5A-D conceptually illustrate compound-nitride CLEs with one or more binary-nitride interfaces.
Figure 5B:
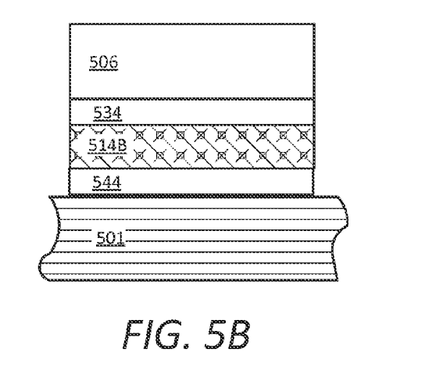

In these figures, the fill pattern components in the CLEs represent the transition metal by the continuous lines slanting downward to the right, the additional element by the dashed lines slanting upward to the right, and the nitrogen by the small hollow squares. In FIG. 5A, binary nitride interface layer 534 is formed over compound nitride interface 514A to contact VR layer 506. In FIG. 5B, bottom binary nitride interface layer 544 contacts the uppermost layer on substrate 501, compound nitride interface 514B is formed over bottom binary nitride interface layer 544, and binary nitride interface layer 534 is formed over compound nitride interface 514B to contact VR layer 506. A CLE with only a bottom binary nitride interface layer 544 contacting substrate 501, though not pictured, is also within the scope. This type of interface layer could be formed, for example, by reactively sputtering the binary nitride layers from a transition-metal target in a nitrogen-containing ambient and reactively co-sputtering the compound nitride layers from a transition-metal target and an Al, B, or Si target in a nitrogen-containing ambient.

Figure 5C:
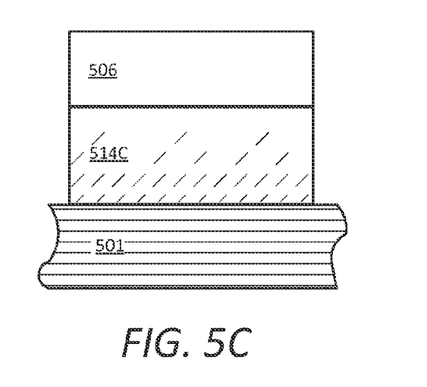
Figure 5D:
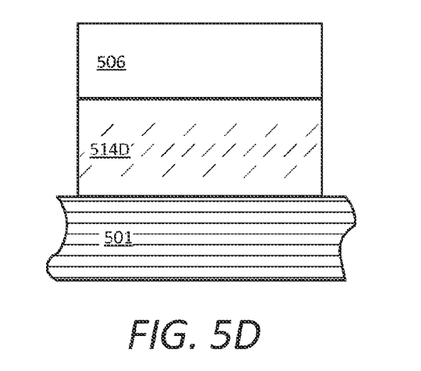

In FIG. 5C, CLE 514C has a gradient composition: The compound nitride is in contact with substrate 501. The concentration of the additional element decreases with distance upward until only the binary transition-metal nitride is in contact with VR layer 506. In FIG. 5D, the interior of CLE 514D is the compound nitride. The concentration of the additional element decreases with distance toward either surface of CLE 514D until only the binary transition-metal nitride is in contact with both VR layer 506 and substrate 501. Various other vertical gradient profiles are also within the scope. The gradients could be produced, for example, by reactively co-sputtering the compound nitride part(s) of the layer from a transition-metal target and an aluminum, boron, or silicon target in a nitrogen-containing ambient, then reducing the power, increasing the throw-distance, or changing the angle of the Al, B, or Si target to decrease the amount of the additional element until entirely ceasing to deposit the additional element (e.g., by closing a shutter between the Al, B, or Si target and the substrate).

Figure 6:
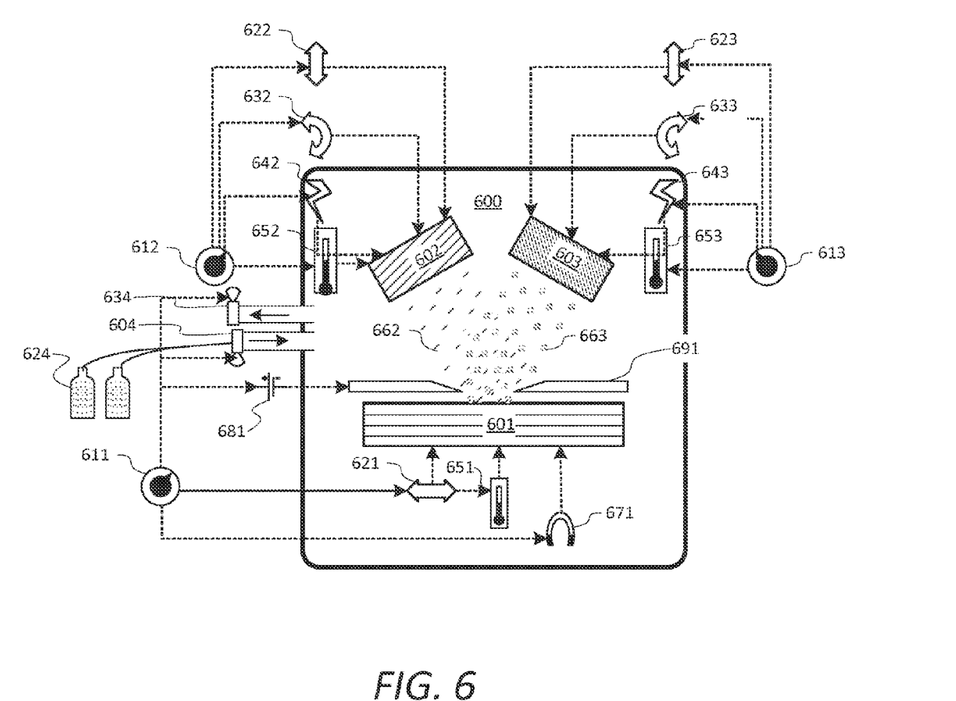
FIG. 6 is a block diagram of co-sputtering in an example PVD chamber.

FIG. 6 is a block diagram of co-sputtering in an example PVD chamber. In chamber 600, substrate 601 receives a first sputtered material 662 from a first target 602 and a second sputtered material 663 from a second target 603. A controller 612 may control one or more of position 622, angle 632, plasma power 642, and temperature 652 of target 602. A controller 613 may control one or more of position 623, angle 633, plasma power 643, and temperature 653 of target 603. Although the illustrated system shows two targets for simplicity, some embodiments may use more than two targets.

Controllers 612 and 613 for the separate targets may independently vary the respective targets' position, angle, plasma power, or temperature in real time as sputtering continues. Thus the separate targets can be sputtered at different plasma power levels or temperatures, or from different throw distances to the substrate, to vary the relative concentrations of each target material being deposited on the substrate. If at least one of the variables can be changed while sputtering continues, the composition of the film may be varied with depth if desired.

Meanwhile, process gases from one or more gas sources 624 may be mixed and injected into chamber 600 through inlet 604. The process gases may be inert (e.g. noble gases) if the gases are not intended to affect the sputtered material. In reactive sputtering, some of the gas is intended to affect the sputtered material. For example, the gas may include an oxidant or nitridant that reacts with sputtered metal to form a metal oxide, nitride, or oxynitride layer. Excess process gas is withdrawn through exhaust 634 by, e.g., a connected vacuum pump (not shown).

Some process chambers also have a controller 611 to vary the position 621, temperature 651, and local magnetic field 671 of substrate 601, and/or to control the mixing of process gases from sources 624 and the flow of process gases into chamber 600 through inlet 604 and out of chamber 600 through exhaust 634. Like the other controllers 612 and 613, controller 611 may be programmable, may be remote from the process chamber and operate via a wireless connection, and may be capable of varying the substrate's position, angle, plasma power, or temperature in real time as sputtering continues. "Position" in this block diagram is symbolized by a single two-headed arrow for simplicity, but it is intended to symbolize position variation in any or all directions. Some process chambers also have a mask 691 to block sputtered materials 662, 663 from reaching selected parts of substrate 601. Optionally, a controllable bias voltage 681 may be applied to mask 691. In process chambers equipped to change the relative position of substrate 601 and mask 691 during processing, different parts of substrate 601 may be sputtered with material having different proportions of first material 662 and second material 663.

Figure 7:
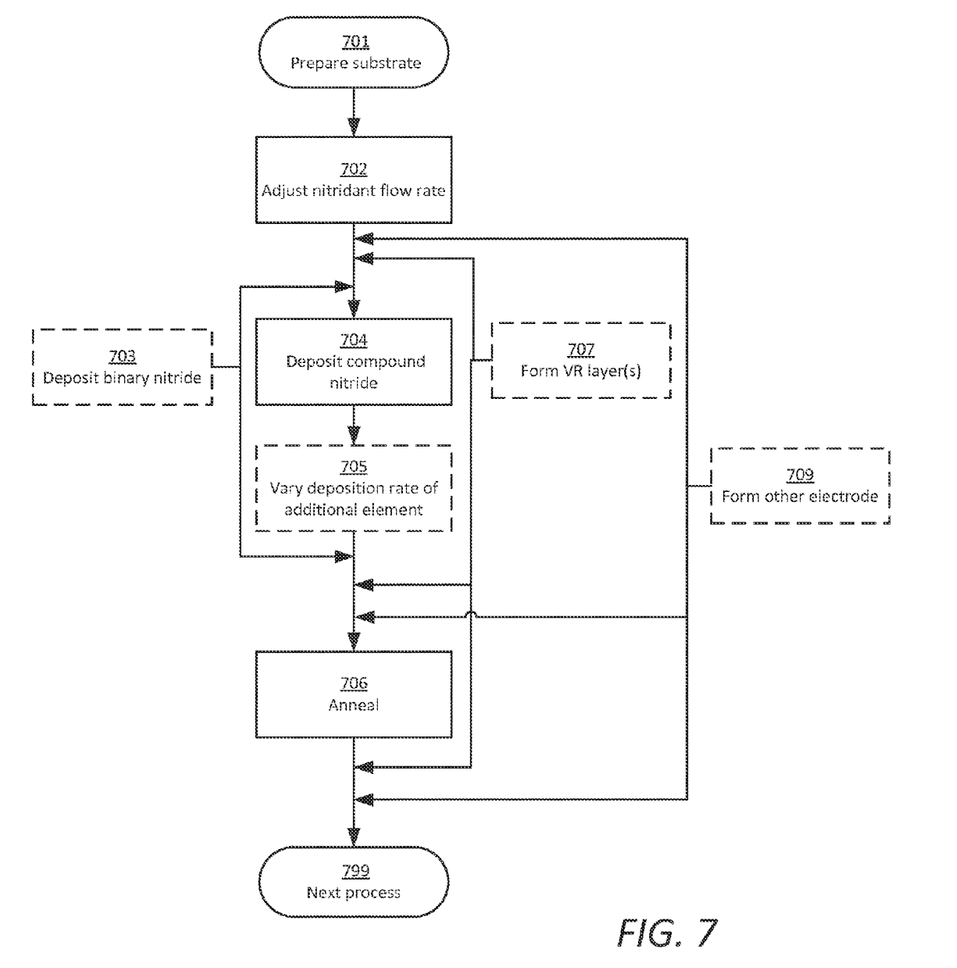
FIG. 7 is a flowchart of an example process for making a ReRAM cell with a CLE.

FIG. 7 is a flowchart of an example process for making a ReRAM cell with a CLE. Step 701 of preparing a substrate may include cleaning, degassing, forming underlying layers or structures, or treating the underlying layers or structures. Step 702 of adjusting the atomic percentage of nitrogen in the compound nitride layer may be done after step 701 and may include adjusting a flow rate of nitrogen relative to a flow rate of all process gases in the nitrogen-containing ambient. Step 704 of sputtering a transition metal and additional element over a substrate in a nitrogen-containing ambient to form a compound nitride layer may be done after step 702. Optional step 705 of varying a deposition rate of the second material may be done after beginning step 704.

Optional step 703 of sputtering the transition metal and additional element in the nitrogen-containing ambient to form a binary transition-metal nitride layer may be done before or after step 704. Optional step 707 of forming a layer of variable-resistance material may be done before or after step 704 and any optional intervening steps. Optional step 709 of forming a conductive layer operable as an electrode may be done before or after step 704 and any optional intervening steps. After the stack is completed, next process 799 may commence.

For example, the additional element may include one of aluminum, boron, or silicon. For example, the transition metal and additional element may be sputtered from a single target or co-sputtered from separate targets. The co-sputtered transition metal and additional element may form a gradient nitride layer by varying the relative amount of material sputtered from each of the separate targets.

For example, the flow rate of nitrogen compared to the flow rate of all process gases may be sufficiently high that the compound nitride layer contains less than 5 at % transition-metal aluminide, boride, or silicide, and sufficiently low that less than 5 at % of the nitrogen in the compound nitride layer diffuses out of the compound nitride layer during the annealing. For example, the flow rate of nitrogen may be between 33% and 37% of the flow rate of all gases in the nitrogen-containing ambient.

For example, the conductive layer operable as an electrode may be another compound-nitride CLE or a conventional electrode. The variable-resistance layer may be a monolithic layer, a bi-layer or stack, or a gradient layer. Anneal temperatures may range from about 500 C to about 800 C. In some embodiments, the anneal temperature may be about 750-800 C when the additional element is silicon, or about 500-550 C when the additional element is aluminum or boron.

Figure 8A:
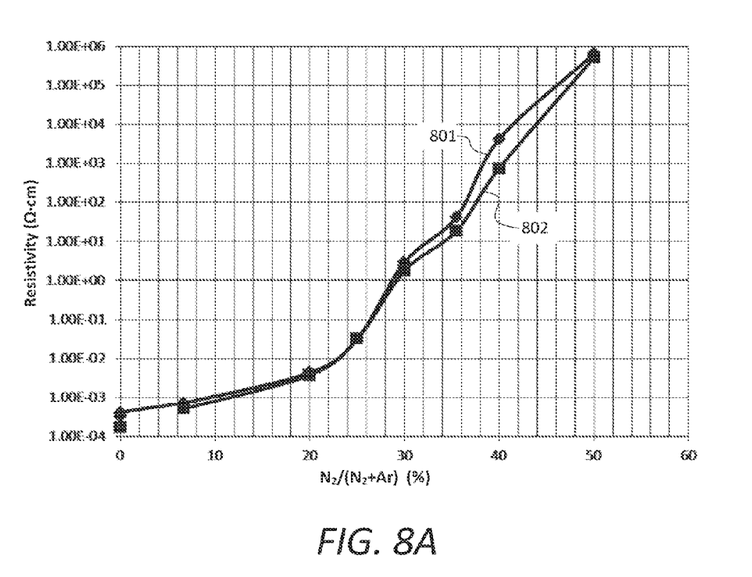
FIGS. 8A-C are sample data graphs of TaSiN CLEs made with different atomic percentages of nitrogen.
Figure 8B:
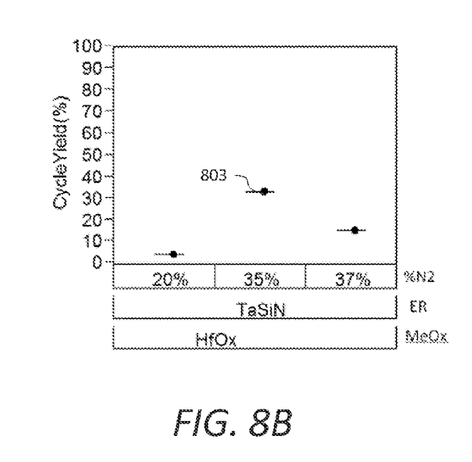
Figure 8C:
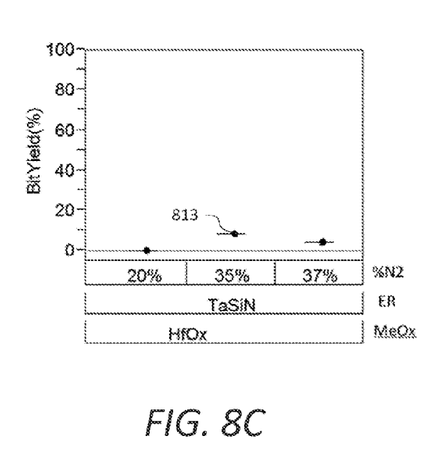

FIGS. 8A-C are sample data graphs of TaSiN CLEs made with different atomic percentages of nitrogen. In FIG. 8A, the measured resistivity of 60 nm thick TaSiN compound nitride layers is plotted against the % nitrogen in the process gas (calculated as the ratio of the flow rate of nitrogen to the combined flow rate of all process gases during sputter deposition). In this experiment, "all process gases" were nitrogen and argon, and for consistent Si content the layers were sputtered from a single TaSi$_3$ target. Power was 200 W on a 2" diameter target for a power density of about 10 W/cm$^2$. Ambient pressure of the N$_2$—Ar mix was 0.005 Torr.

Curve 801 was measured before annealing and curve 802 was measured after annealing in forming gas (N$_2$—H$_2$ mixture) for 1 minute at 750 C. Many ReRAM devices require a similar anneal to activate the diodes used as current steering elements. The pre-anneal and post-anneal resistivities are fairly close, across the entire measured range and particularly for the CLE desired range of 0.1-100 Ω·cm. These results indicate that these CLE materials can withstand the thermal budget for ReRAM with current-steering diodes.

FIG. 8B plots the cycle yield and FIG. 8C plots the bit yield for selected values of % nitrogen in the process gas. Both the peak cycle yield 803 and the peak bit yield 813 coincide with 35% nitrogen in the process gas. Returning to FIG. 8A, 35% nitrogen in the process gas produces a resistivity of 10 Ω·cm, well within the desired range.

The actual at % nitrogen content of the layers, measured by XPS, was about 32% when 35% nitrogen was in the process gas and about 27% when 30% nitrogen was in the process gas. Further experiments identified 22-32 at % N and 22-26 at % Si as a range that provides both low formation of metal silicide (<3 at % measured by XPS) and low out-diffusion of nitrogen during anneal (observed as post-anneal change in resistivity).

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A device comprising:
   a first layer formed over a substrate,
      wherein the first layer is operable as a first electrode;
   a second layer formed over the first layer,
      wherein the second layer is operable to reversibly change resistance between at least two stable states responsive to a write signal;
   a third layer formed over the second layer,
      wherein the third layer is operable as a second electrode;
      wherein the first layer or the third layer is a constant-resistance layer operable as a current-limiting electrode;
   wherein the constant-resistance layer comprises a first portion and a second portion,
      wherein the first portion comprises a compound nitride of a transition metal and an additional element;
      wherein the second portion comprises a binary nitride;
      wherein the second portion directly interfaces the second layer; and
      wherein the additional element comprises at least one of aluminum, boron, or silicon.

2. The device of claim 1, wherein a vertical resistance through the constant-resistance layer is between 10 and 1000 kΩ; and wherein a device dimension is between 10 nm and 500 nm.

3. The device of claim 1, wherein the transition metal comprises at least one of hafnium, molybdenum, tantalum, titanium, or tungsten.

4. The device of claim 1, wherein a thickness of the constant-resistance layer is between 5 nm and 100 nm; wherein the compound nitride comprises silicon; and wherein a resistivity of the constant-resistance layer is between 0.1 Ω·cm and 100 Ω·cm.

5. The device of claim 1, wherein the second layer comprises an oxide, nitride or oxynitride of at least one of aluminum, hafnium, silicon, titanium, tantalum, or zirconium.

6. The device of claim 1, wherein both the first layer and the third layer are constant-resistance layers.

7. The device of claim 1, wherein the binary nitride contains less than 5 at % of the additional element.

8. The device of claim 7, wherein a portion of the second layer contacting the constant-resistance layer comprises an oxide, nitride or oxynitride of silicon.

9. The device of claim 7, wherein the constant-resistance layer comprise a third portion comprising the binary nitride; and wherein the first portion is disposed between the second portion and the third portion.

10. The device of claim 1, wherein an atomic percentage of nitrogen in the compound nitride is between 15% and 32%.

11. The device of claim 1, wherein an atomic percentage of silicon in the compound nitride is between 15% and 26%.

12. The device of claim 1, wherein the additional element comprises aluminum.

13. The device of claim 1, wherein the additional element comprises boron.

14. The device of claim 1, wherein the additional element comprises silicon.

15. The device of claim 1, wherein the transition metal comprises hafnium.

16. The device of claim 1, wherein the transition metal comprises molybdenum.

17. The device of claim 1, wherein the transition metal comprises tantalum.

18. The device of claim 1, wherein the second portion and the second layer do not share any elements.

19. The device of claim 18, wherein the second portion comprises titanium nitride, and the second layer comprises silicon dioxide.

20. The device of claim 1, wherein the binary nitride of the second portion comprises the transition metal.

* * * * *